United States Patent
Gardoni et al.

(10) Patent No.: US 10,455,733 B2
(45) Date of Patent: Oct. 22, 2019

(54) LIQUID COOLING SYSTEM AND METHOD

(71) Applicant: ABB Schweiz AG, Baden (CH)

(72) Inventors: Irene Gardoni, Untersiggenthal (CH); Manfred Kipfer, Eschenbach (CH); Erika De-Candido, Ennetbaden (CH)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 16/306,045

(22) PCT Filed: Jun. 1, 2016

(86) PCT No.: PCT/EP2016/062391
§ 371 (c)(1),
(2) Date: Nov. 30, 2018

(87) PCT Pub. No.: WO2017/207048
PCT Pub. Date: Dec. 7, 2017

(65) Prior Publication Data
US 2019/0132991 A1 May 2, 2019

(51) Int. Cl.
*H05K 7/20* (2006.01)
*F01P 11/02* (2006.01)

(52) U.S. Cl.
CPC ..... *H05K 7/20272* (2013.01); *H05K 7/20218* (2013.01); *H05K 7/20627* (2013.01); *H05K 7/20763* (2013.01); *H05K 7/20872* (2013.01); *H05K 7/20927* (2013.01); *F01P 11/028* (2013.01)

(58) Field of Classification Search
CPC .......... F01P 11/028; F01P 11/029; F01P 3/20; F01P 11/0285; H05K 7/20781; H05K 7/20272; H05K 7/2079; H05K 7/20927; H05K 7/20218; H05K 7/20254; H05K 7/20872; H05K 7/20627; H05K 7/20763
See application file for complete search history.

(56) References Cited

U.S. PATENT DOCUMENTS

| 3,989,102 A | 11/1976 | Jaster et al. |
| 4,047,561 A | 9/1977 | Jaster et al. |

(Continued)

FOREIGN PATENT DOCUMENTS

| EP | 1637020 A1 | 3/2006 |
| EP | 1637020 B1 | 3/2006 |

(Continued)

OTHER PUBLICATIONS

International Preliminary Report on Patentability Application No. PCT/EP2016/062391 dated Aug. 17, 2018 24 pages.

(Continued)

*Primary Examiner* — Adam B Dravininkas
(74) *Attorney, Agent, or Firm* — Whitmyer IP Group LLC

(57) ABSTRACT

A liquid cooling system for cooling an electrical component, the liquid cooling system including a cooling circuit having at least one supply branch for supplying liquid coolant to an electrical component; and a de-aeration line to provide a connection between a high point and a junction point of the cooling circuit to bypass a part of the cooling circuit; wherein the pressure of the liquid coolant is lower in the junction point than in the high point during circulation of the liquid coolant in the liquid cooling system.

17 Claims, 2 Drawing Sheets

(56) References Cited

U.S. PATENT DOCUMENTS

| | | | | |
|---|---|---|---|---|
| 4,785,874 | A * | 11/1988 | Avrea | F01P 11/0238 123/41.51 |
| 5,535,818 | A * | 7/1996 | Fujisaki | F28F 27/00 165/104.25 |
| 2012/0090348 | A1 | 4/2012 | O'Rourke et al. | |
| 2012/0183815 | A1 * | 7/2012 | Johnston | B60L 3/0046 429/50 |
| 2013/0050931 | A1 * | 2/2013 | Heiland | H05K 7/20827 361/679.33 |
| 2013/0327511 | A1 * | 12/2013 | Johnston | F28F 9/02 165/173 |
| 2015/0107919 | A1 * | 4/2015 | Hutchins | B60K 6/48 180/65.25 |
| 2016/0303493 | A1 * | 10/2016 | Dailey | B01D 19/0073 |
| 2017/0167806 | A1 * | 6/2017 | Joyce | F28D 9/0093 |

FOREIGN PATENT DOCUMENTS

| | | | |
|---|---|---|---|
| EP | 2790480 | A2 | 10/2014 |
| JP | 2013204847 | A | 10/2013 |

OTHER PUBLICATIONS

International Search Report and Written Opinion of the International Searching Authority Application No. PCT/EP2016/062391 Completed: Oct. 13, 2016; dated Oct. 21, 2016 13 pages.
Written Opinion of the International Searching Authority Application No. PCT/EP2016/062391 dated Apr. 24, 2018 8 pages.

* cited by examiner

LIQUID COOLING SYSTEM AND METHOD

TECHNICAL FIELD

The present disclosure generally relates to a liquid cooling system. In particular, a liquid cooling system for cooling at least one electrical component and a method of operating a liquid cooling system for cooling at least one electrical component are provided.

BACKGROUND

Various solutions exist in order to deaerate liquid coolants for liquid cooling systems by removing air and gas entrapped in the liquid medium.

US 2012090348 A1 discloses a cooling system having a closed-loop cooling circuit. The system comprises a coolant reservoir, a pump, fluid passages in a battery charging module, fluid passages in a power electronics module and a heat exchanger. The coolant reservoir includes a body portion defining an interior cavity configured to hold a coolant and a barrier wall positioned within the body portion to partition the interior cavity into an upper chamber and a lower chamber where the barrier wall defines an opening therethrough that allows fluid communication between the lower chamber and the upper chamber. The barrier wall prevents the air in the upper chamber from mixing with the coolant in the lower chamber.

EP 1637020 B1 discloses a cooling system for cooling a switchgear cabinet. The cooling system comprises a coolant circuit, having a forward-flow line and a return-flow line, and individual appliance supply lines for supplying coolant to individual cooling bodies. The forward-flow line and the return-flow line are connected via a connecting line having a manually operated venting device.

U.S. Pat. No. 4,047,561 A discloses a closed loop forced liquid cooling system comprising a main cooling duct loop and a combined gas separator and pressurizer with a heating element mounted in a bypass branch of the main cooling duct loop. The main cooling duct loop is arranged at a single level and comprises a pump 10 for supplying cooling liquid to a network of pipes for circulation in contact with hot surfaces of a heat-producing electronic equipment. The heated coolant is then cooled by a heat exchanger before being returned to the pump inlet.

SUMMARY

One object of the present disclosure is to provide a liquid cooling system having a simple structure and a reduced number of components.

A further object of the present disclosure is to provide a liquid cooling system that provides an effective de-aeration of the liquid coolant.

A still further object of the present disclosure is to provide a liquid coolant system that can operate without danger for an operator and without leaking liquid coolant on electrical components.

According to one aspect, there is provided a liquid cooling system for cooling at least one electrical component, the liquid cooling system comprising a cooling circuit having at least one supply branch for supplying liquid coolant to an electrical component; and at least one de-aeration line to provide a connection between a high point and a junction point of the cooling circuit to bypass a part of the cooling circuit; wherein the pressure of the liquid coolant is lower in the junction point than in the high point during circulation of the liquid coolant in the liquid cooling system.

In liquid cooling systems, there is a risk that air and gas entrapped in the liquid coolant accumulate in highest points of the system. For example, air may be entrapped in the liquid coolant when filling up the system. Gases may be produced by electrolysis processes or when the liquid coolant temperature is increased.

The at least one de-aeration line may thus constitute, or constitute a part or section of, a deaerating path that connects one or more high points of the cooling circuit to a line where the pressure of the liquid coolant is lower, for example an outlet line or return flow line of the cooling circuit. By continuously circulating the liquid coolant in the cooling circuit, a first part of the liquid coolant can flow through the at least one supply branch to cool a respective electrical component.

At the same time, a second part of the liquid coolant flow can be divided from one or several high points of the at least one supply branch and guided through the de-aeration line in order to remove the liquid coolant containing (or containing a relatively high amount of) air or gas. By deviating the second part of the liquid coolant flow through the de-aeration line and recirculating this part in the liquid cooling system, the accumulation of gas and air in high points (and/or local high points) can be avoided. The second part of the liquid coolant flow guided through the de-aeration line may be 0.5-30%, such as 0.5-10%, such as 0.5-5% of the first part of the liquid coolant flow guided through the cooling circuit.

The liquid cooling system may further comprise a de-aeration vessel arranged downstream of the junction point, e.g. upstream of a heat exchanger, in order to remove the air and gas entrapped in the liquid coolant. Alternatively, or in addition, a de-aeration vessel may be arranged upstream of the junction point to cool the second liquid coolant flow.

Throughout the present disclosure, the cooling circuit may alternatively be referred to as a cooling medium distribution circuit and the de-aeration line may alternatively be referred to as a bypass line. The language "to provide a connection" includes both variants where a line constitutes the entire connection as well as variants where the line only constitutes a part of the connection.

The liquid cooling system may comprise more than one de-aeration line to provide a connection between a high point and a junction point of the cooling circuit. For example, two or more de-aeration lines may provide a connection between one single high point of the cooling circuit and two or more separate junction points of the cooling circuit. Alternatively, two or more de-aeration lines may provide a connection between two or more separate high points of the cooling circuit and one single junction point of the cooling circuit. As a further alternative, two or more de-aeration lines may provide connections between two or more high points of the cooling circuit and respective two or more junction points of the cooling circuit.

The high point may be a high point of the at least one supply branch. It is however alternatively possible to design the cooling circuit such that the high point is positioned at other locations of the cooling circuit than in the supply branch for supplying liquid coolant to the electrical component. In case the high point is a high point of the at least one supply branch, the high point may be the highest point of the at least one supply branch. This highest point may or may not be the highest point of the cooling circuit. In other words, this highest point may or may not be a locally highest point.

The junction point may be geodetically below the high point. Thus, the junction point may be constituted by a low point. A geodetically higher point is vertically above a geodetically lower point. The at least one supply branch may thus be arranged to elevate liquid coolant to and/or from the electrical component. Thus, at least a part of the supply branch may propagate in a direction having a vertical component. In order to elevate the liquid coolant to the high point, the liquid coolant needs to be sufficiently pressurized in a section of the supply branch upstream of the high point. Once the high point is reached by the liquid coolant, the pressure decreases as the liquid coolant flows downstream from the high point.

However, as long as the pressure of the liquid coolant is lower in the junction point than in the high point during circulation of the liquid coolant in the liquid cooling system, the junction point does not necessarily have to be geodetically below the high point. Thus, according to one variant, the junction point is geodetically above the high point.

The liquid cooling system may comprises a plurality of supply branches for supplying liquid coolant to a plurality of electrical components; and at least one de-aeration line to provide a connection between each high point of the supply branches and at least one junction point of the cooling circuit; wherein the pressure of the liquid coolant is lower in the at least one junction point than in the respective high point connected to the junction point by means of the de-aeration line.

The at least one junction point may be geodetically below the respective high point connected to the junction point by means of the de-aeration line. Each supply branch may thus be arranged to elevate liquid coolant to the respective electrical component.

The at least one de-aeration line may provide a connection between each high point of the supply branches and one single junction point of the cooling circuit. Alternatively, the de-aeration line may provide several connections between a high point of several separate supply branches and several separate junction points. Thus, the liquid cooling system may comprise several parallel de-aeration lines.

The cooling circuit may comprises an inlet flow line and a return flow line wherein the at least one supply branch provides a connection between the inlet flow line and the return flow line.

The liquid cooling system may comprise a pump for circulating the liquid coolant in the cooling circuit. The pump may be arranged to discharge high pressure liquid coolant to the inlet flow line.

Furthermore, the liquid cooling system may comprise a heat exchanger to cool the liquid coolant after circulation through the cooling circuit. The heat exchanger may be provided on the return flow line downstream of the last of the at least one supply branch.

In case the cooling circuit comprises an inlet flow line and a return flow line, the at least one junction point may be provided on the return flow line. In case several supply branches provide connections between the inlet flow line and the return flow line, several junction points may be provided immediately downstream of each supply branch.

The liquid cooling system may further comprise at least one electrical component to be cooled. The at least one electrical component may be constituted by one or more power modules, such as converters.

The inlet flow line may be located geodetically below the at least one electrical component. The at least one supply branch may thus extend substantially vertically to provide liquid coolant to cool a respective electrical component.

The at least one high point may be a local high point. Alternatively, or in addition, the at least one high point may be a geodetically highest point of the cooling circuit.

The liquid cooling system may further comprise a valve for closing the de-aeration line. The de-aeration line can thereby be closed with the valve when de-aeration is not required. For example, a continuous circulation of liquid coolant through the de-aeration line may not be necessary at all times. Instead, the de-aeration may be carried out at commissioning and/or during scheduled maintenance. The liquid cooling system may comprise more than one valve, for example in case several de-aeration lines provide connections to several separate junction points. The one or more valves may be manually operable.

According to a further aspect, there is provided a method of operating a liquid cooling system for cooling at least one electrical component, the method comprising the steps of circulating liquid coolant in a cooling circuit having at least one supply branch for supplying liquid coolant to an electrical component; connecting at least one high point and a junction point of the cooling circuit to bypass a part of the cooling circuit; wherein the pressure of the liquid coolant is lower in the junction point than in the high point. The step of connecting at least one high point and a junction point of the cooling circuit may be constituted by the step of connecting at least one high point of the at least one supply branch and a junction point of the cooling circuit.

The method may further comprise the step of closing or opening a de-aeration line connected between the at least one high point and the junction point by means of a valve. The valve may be manually operable.

BRIEF DESCRIPTION OF THE DRAWINGS

Further details, advantages and aspects of the present disclosure will become apparent from the following embodiments taken in conjunction with the drawings, wherein.

DETAILED DESCRIPTION

Figure 1:
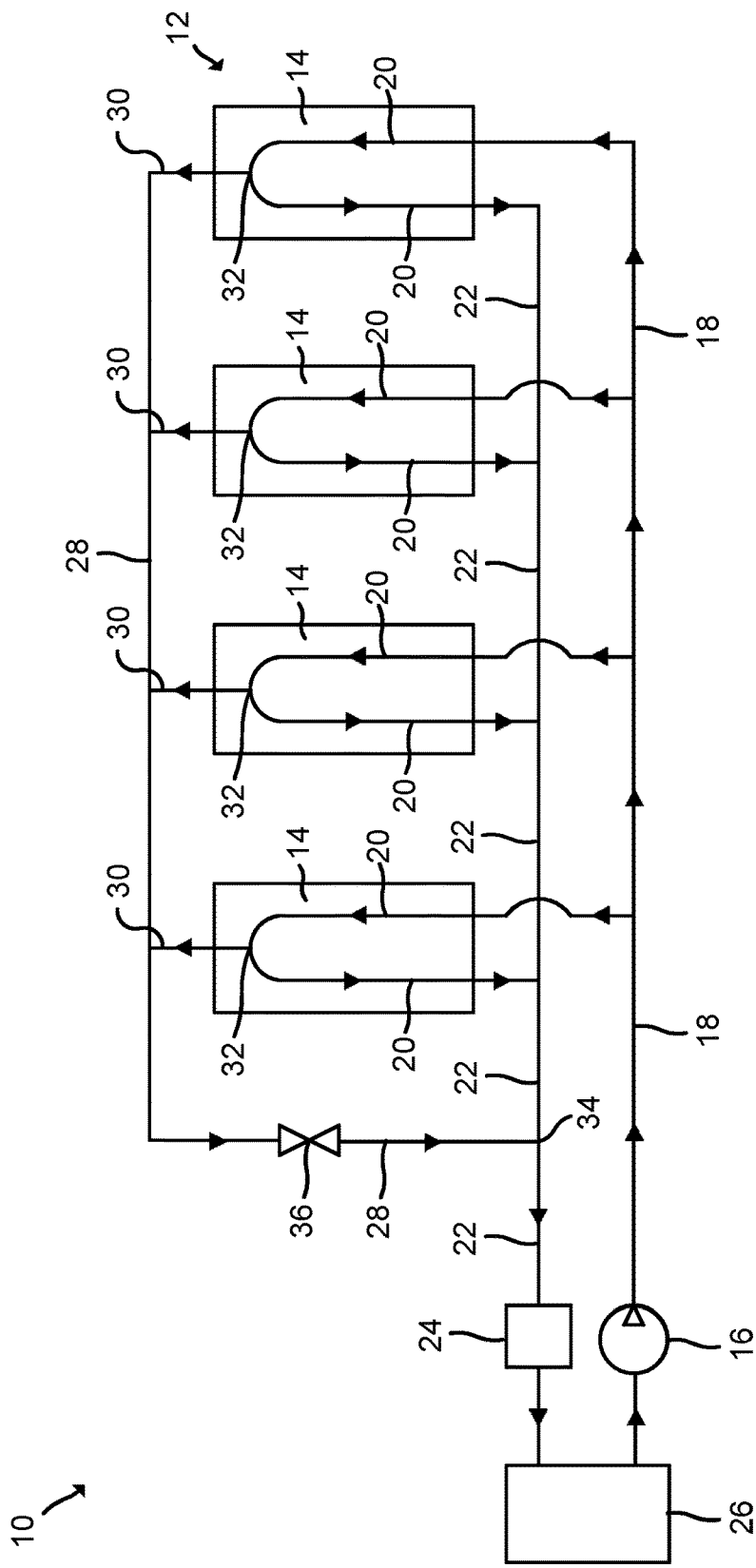
FIG. 1 schematically represents a liquid cooling system.

In the following, a liquid cooling system for cooling at least one electrical component and a method of operating a liquid cooling system for cooling at least one electrical component will be described. The same reference numerals will be used to denote the same or similar structural features.

FIG. 1 schematically represents a liquid cooling system 10. The liquid cooling system 10 comprises a cooling circuit 12 for cooling a plurality of electrical components 14. In FIG. 1, the electrical components 14 are constituted by four power modules, such as PEBBs (Power Electronic Building Blocks). The number of power modules is merely an example.

The liquid cooling system 10 comprises a pump 16 for delivering pressurized and cooled liquid coolant to an inlet flow line 18 of the cooling circuit 12. The cooling circuit 12 further comprises four supply branches 20, each for supplying liquid coolant to a respective electrical component 14 to be cooled.

A first supply branch 20 (the leftmost supply branch 20 in FIG. 1) branches off from the inlet flow line 18 and elevates to a first electrical component 14 to cool the same and back to a return flow line 22. Similarly, a second and third supply branch 20 branch off from the inlet flow line 18 and elevate to a respective second and third electrical component 14 to be cooled and back to the return flow line 22. For providing liquid coolant to the last electrical component 14 (here, the fourth electrical component 14), the inlet flow line 18 transitions into the fourth supply branch 20 (i.e. the fourth supply branch 20 does not branch off from the inlet flow line 18) to cool the fourth electrical component 14 and back to the return flow line 22. The supply branches 20 in FIG. 1 thus have a parallel relationship.

In FIG. 1, each electrical component 14 is positioned geodetically above the inlet flow line 18. Thereby, each supply branch 20 may be said to elevate liquid coolant to the respective electrical component 14.

The path of the supply branches 20 in the respective electrical component 14 is merely schematically illustrated. Each supply branch 20 may guide the cooling liquid in a path layout that provides the best cooling for the respective electrical component 14. For example, each supply branch 20 may be laid in a serpentine shape along one or several surfaces of each electrical component 14 to provide a good cooling of the same.

The liquid cooling system 10 further comprises a de-aeration vessel 24 to remove the air and gas entrapped in the liquid coolant in the return flow line 22 and a heat exchanger 26 for cooling the liquid coolant, heated when cooling the electrical components 14, before being circulated again in the cooling circuit 12.

The liquid cooling system 10 further comprises a de-aeration line 28. A de-aeration conduit 30 associated with each supply branch 20 connect a geodetically high point 32 to the de-aeration line 28. In the implementation of FIG. 1, a high point 32 constituting a geodetically highest point of each supply branch 20 is connected to the de-aeration line 28. The high points 32 of the supply branches 20 are substantially horizontally aligned and also constitute the vertically highest points of the cooling circuit 12.

The de-aeration line 28 is connected to the return flow line 22 at a junction point 34. More specifically, the junction point 34 is positioned downstream of the first supply branch 20 (i.e. the left supply branch 20 in FIG. 1). Thus, the de-aeration line 28 functions as a bypass line that bypasses a part of the main flow through the cooling circuit 12. Moreover, the de-aeration line 28 provides a connection between the high points 32 of the supply branches 20 and the junction point 34 of the cooling circuit 12.

When the liquid coolant is circulated in the cooling circuit 12 and reaches a high point 32, the pressure in the liquid coolant will decrease downstream of the high point 32. Since the junction point 34 is geodetically below each high point 32 of the respective supply branch 20 in FIG. 1, also the gravity force will contribute to a decreasing liquid coolant pressure downstream of each high point 32 of the respective supply branch 20. Thus, the pressure is lower in the junction point 34 than in each high point 32 of the supply branches 20.

The liquid cooling system 10 further comprises a valve 36. The valve 36 is arranged on the de-aeration line 28 and is moveable between a closed position and an open position (optionally also to any intermediate position) in order to close and open the de-aeration line 28 (or restrict the flow in the de-aeration line 28). In this implementation, the valve 36 is manually operable.

When the valve 36 adopts the closed position and the pump 16 is running, the entire flow of liquid coolant is circulated in the cooling circuit 12. In this mode of operation, air and gas entrapped in the liquid coolant might accumulate in the high points 32 of the supply branches 20. As a consequence, the cooling provided by the cooling circuit 12 might be deteriorated.

In order to remove the air and gas entrapped in the liquid coolant and accumulated in the high points 32 of the supply branches 20, the valve 36 may be opened. This may be done while the liquid cooling system 10 is operating, i.e. as the liquid coolant circulates in the cooling circuit 12. When the valve 36 adopts the open position, the flow of liquid coolant is divided into a first part circulating in the cooling circuit 12, i.e. from the inlet flow line 18, through the supply branches 20 and to the return flow line 22, and a second part constituting a bypass flow. This second part of the liquid coolant flow is guided from the inlet flow line 18, to a respective supply branch 20, to a high point 32 of the respective supply branch 20, to a de-aeration conduit 30 connected to a respective high point 32, to the de-aeration line 28, through the valve 36 and to the junction point 34 where the first and second flows of liquid coolant are joined. In the implementation of FIG. 1, the second flow may constitute, for example, approximately 2% of the first flow.

In this manner, any air and gas entrapped at the high points 32 are removed with the second liquid coolant flow. More specifically, liquid coolant containing the air and gas (or containing a high amount of air and gas), i.e. "low quality" liquid coolant, is transported away from the respective high point 32. The air and gas may then be removed from the liquid coolant by means of the de-aeration vessel 24. The liquid coolant purified by the de-aeration vessel 24 may then be circulated anew in the liquid cooling system. Since air and gas is removed from the high points 32, the cooling effect is improved. More specifically, the liquid coolant approaching the high points 32 is not blocked by air and gas (or is blocked to a reduced extent).

The valve 36 may be left open to continue bypassing a partial flow (i.e. the second flow) through the de-aeration line 28 during further operation of the liquid cooling system 10. Alternatively, the valve 36 may be closed again to circulate all liquid coolant in the cooling circuit 12.

As an alternative design, the liquid cooling system 10 may comprise a de-aeration line 28 associated with each high point 32. A fourth de-aeration line 28 may provide a connection between the fourth high point 32 (i.e. the rightmost high point 32 in FIG. 1) and a junction point 34 on the return flow line 22 downstream of the fourth supply branch 20 but upstream of the third supply branch 20. A third and second de-aeration line 28 associated with the respective third and second high point 32 may provide a connection between the respective third and second high point 32 and a respective junction point 34 on the return flow line 22 downstream of the third and second supply branch 20, respectively, but upstream of the second and first supply branch 20, respectively. A first de-aeration line 28 may provide a connection between the first high point 32 and a junction point 34 on the return flow line 22 downstream of the first supply branch 20.

Figure 2:
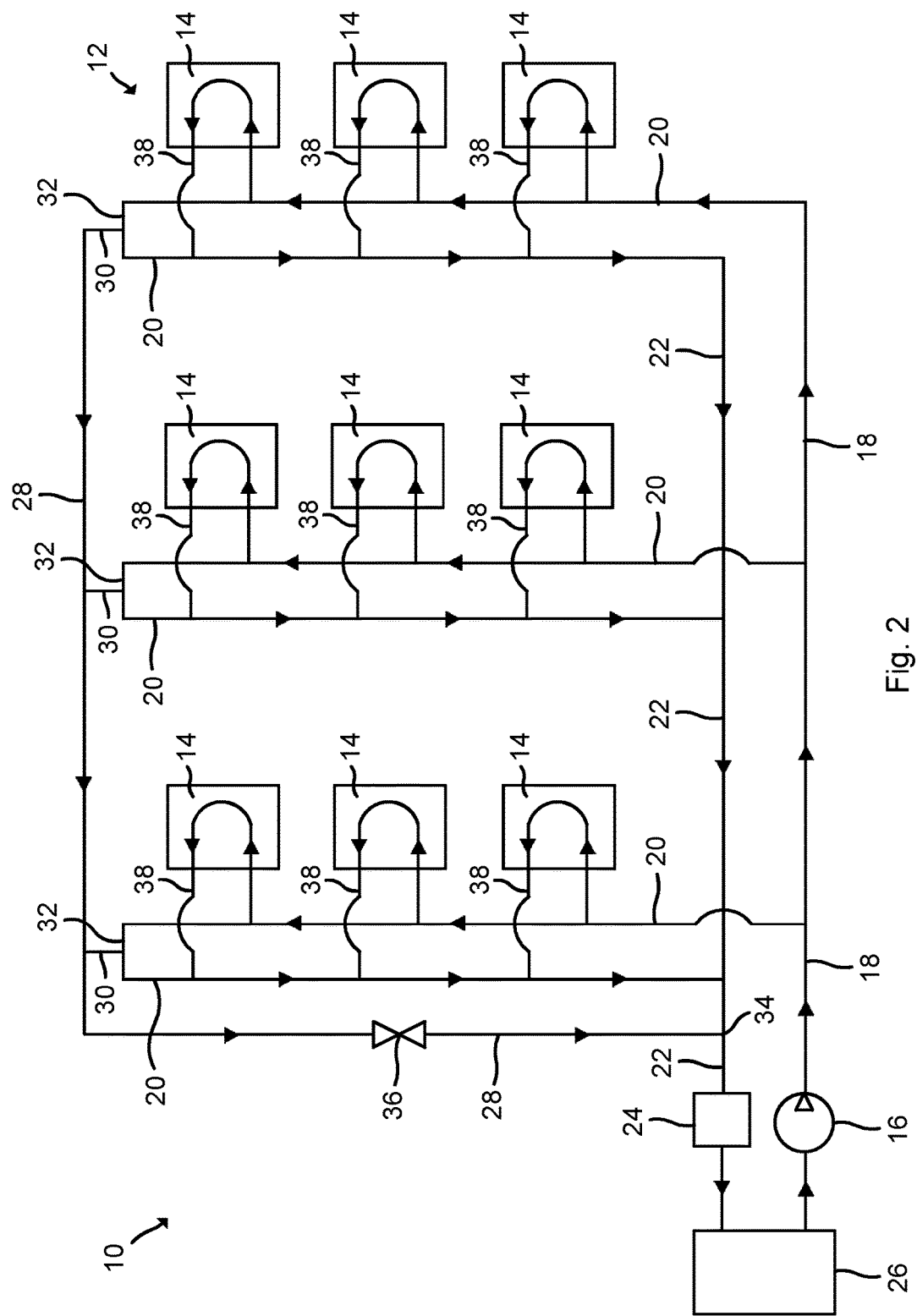
FIG. 2 schematically represents a further liquid cooling system.

FIG. 2 schematically represents a further liquid cooling system 10. Mainly differences with respect to the liquid cooling system 10 of FIG. 1 will be described.

The liquid cooling system 10 of FIG. 2 comprises nine electrical components 14 to be cooled. Also in FIG. 2, the electrical components 14 are constituted by power modules. A first set of three electrical components 14 are cooled by a first supply branch 20, a second set of three electrical components 14 are cooled by a second supply branch 20 and a third set of three electrical components 14 are cooled by a third supply branch 20. The supply branches 20 of the cooling circuit 12 have a parallel relationship.

Each supply branch 20 comprises three sub-branches 38 where one sub-branch 38 is associated with each electrical component 14. Each sub-branch 38 is connected to a point on the supply branch 20 upstream of the high point 32 and to a point on the supply branch 20 downstream of the high point 32. For each supply branch 20, the sub-branches 38 thus have a parallel relationship. The high points 32 of the supply branches 20 are connected to the return flow line 22 in the same manner as in FIG. 1.

In FIG. 2, each sub-branch 38 diverts in a substantially horizontal direction from a portion of the supply branch 20 upstream of the high point 32 and to a respective electrical component 14 to be cooled. Any air or gas in the liquid coolant in the inlet flow line 18 is therefore less likely to be circulated in a sub-branch 38 to an electrical component 14. Instead, any air or gas in the liquid coolant in the inlet flow line 18 is more prone to rise (due to its lower weight) directly to a respective high point 32 without being introduced in a sub-branch 38. Also in this manner, the cooling effect of the liquid cooling system 10 is improved.

While the present disclosure has been described with reference to exemplary embodiments, it will be appreciated that the present invention is not limited to what has been described above. For example, it will be appreciated that the dimensions of the parts may be varied as needed. Accordingly, it is intended that the present invention may be limited only by the scope of the claims appended hereto.

The invention claimed is:

1. A liquid cooling system for cooling at least one electrical component, the liquid cooling system comprising:
   a cooling circuit having an inlet flow line, a return flow line, and at least one supply branch for supplying liquid coolant to an electrical component; and
   at least one de-aeration line to provide a connection between a high point and a junction point of the cooling circuit to bypass a part of the cooling circuit;
wherein the high point constitutes a geodetically or locally highest point of the at least one supply branch;
wherein the junction point is provided on the return flow line downstream of the at least one supply branch; wherein the pressure of the liquid coolant is lower in the junction point than in the high point during circulation of the liquid coolant in the liquid cooling system.

2. The liquid cooling system according to claim 1, wherein the high point constitutes a geodetically highest point of the at least one supply branch.

3. The liquid cooling system according to claim 1, wherein the junction point is geodetically above the high point.

4. The liquid cooling system according to claim 2, wherein the at least one supply branch provides a connection between the inlet flow line and the return flow line.

5. The liquid cooling system according to claim 2, further including at least one electrical component to be cooled.

6. The liquid cooling system according to claim 1, wherein the junction point is geodetically below the high point.

7. The liquid cooling system according to claim 1, wherein the liquid cooling system includes:
   a plurality of supply branches for supplying liquid coolant to a plurality of electrical components; and
   at least one de-aeration line to provide a connection between each high point of the supply branches and at least one junction point of the cooling circuit;
wherein the pressure of the liquid coolant is lower in the at least one junction point than in the respective high point connected to the junction point by means of the de-aeration line.

8. The liquid cooling system according to claim 7, wherein the at least one junction point is geodetically below the respective high point connected to the junction point by means of the de-aeration line.

9. The liquid cooling system according to claim 8, wherein the at least one de-aeration line provides a connection between each high point of the supply branches and one single junction point of the cooling circuit.

10. The liquid cooling system according to claim 7, wherein the at least one de-aeration line provides a connection between each high point of the supply branches and one single junction point of the cooling circuit.

11. The liquid cooling system according to claim 1, wherein the at least one supply branch provides a connection between the inlet flow line and the return flow line.

12. The liquid cooling system according to claim 11, wherein the inlet flow line is located geodetically below the at least one electrical component.

13. The liquid cooling system according to claim 1, further including at least one electrical component to be cooled.

14. The liquid cooling system according to claim 13, wherein the inlet flow line is located geodetically below the at least one electrical component.

15. The liquid cooling system according to claim 1, wherein the at least one high point constitutes a locally highest point of the at least one supply branch.

16. The liquid cooling system according to claim 1, further including a valve for closing the de-aeration line.

17. A method of operating a liquid cooling system for cooling at least one electrical component, the method comprising the steps of:
   circulating liquid coolant in a cooling circuit having an inlet flow line, a return flow line, and at least one supply branch for supplying liquid coolant to an electrical component; and
   connecting at least one high point and a junction point of the cooling circuit to bypass a part of the cooling circuit;
wherein the high point constitutes a geodetically or locally highest point of the at least one supply branch;
wherein the junction point is provided on the return flow line downstream of the at least one supply branch; wherein the pressure of the liquid coolant is lower in the junction point than in the high point.

* * * * *